(12) United States Patent
Tsai

(10) Patent No.: US 7,682,179 B1
(45) Date of Patent: Mar. 23, 2010

(54) ELECTRICAL CONNECTOR HAVING ELASTIC CARD-EJECTING MEMBER

(76) Inventor: Chou Hsien Tsai, 15F, No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 11 days.

(21) Appl. No.: 12/207,438

(22) Filed: Sep. 9, 2008

(51) Int. Cl.
*H01R 13/62* (2006.01)

(52) U.S. Cl. .................. 439/326; 439/328; 439/329

(58) Field of Classification Search ......... 439/326–329, 439/260
See application file for complete search history.

(56) References Cited

U.S. PATENT DOCUMENTS

| | | | | |
|---|---|---|---|---|
| 4,084,874 A | * | 4/1978 | Georgopulos | 439/326 |
| 4,700,998 A | * | 10/1987 | Hvezda et al. | 439/325 |
| 4,743,746 A | * | 5/1988 | Murschall et al. | 439/326 |
| 5,224,873 A | * | 7/1993 | Duffet et al. | 439/326 |
| 5,816,838 A | * | 10/1998 | Del Prete et al. | 439/326 |
| 6,971,899 B1 | * | 12/2005 | Liu | 439/326 |
| 7,134,896 B1 | * | 11/2006 | Chen | 439/326 |
| 7,182,618 B1 | * | 2/2007 | Choy et al. | 439/328 |
| 7,217,148 B1 | * | 5/2007 | Chen | 439/326 |
| 7,252,231 B2 | * | 8/2007 | Ho | 235/441 |
| 7,470,136 B2 | * | 12/2008 | Yahiro et al. | 439/326 |

* cited by examiner

*Primary Examiner*—Briggitte R Hammond
(74) *Attorney, Agent, or Firm*—Pro-Techtor Int'l Services; Ralph Willgohs

(57) ABSTRACT

An electrical connector disposed on a main board and connected to and engaged with a circuit board includes a plastic base, terminals, a board engaging structure and an elastic card-ejecting member. The plastic base is fixed to the main board and formed with a connection slot having an opening. One end of the circuit board may be inserted into the opening. Each terminal disposed on the plastic base has a projecting connection point disposed on the connection slot. The board engaging structure has an engaging portion, which can engage with the circuit board when the circuit board is inserted into the connection slot. The elastic card-ejecting member enters a forced state when the circuit board is inserted into the connection slot by a stroke, and pushes the circuit board out by another stroke so that the circuit board is engaged with the engaging portion when the elastic card-ejecting member bounces.

17 Claims, 15 Drawing Sheets

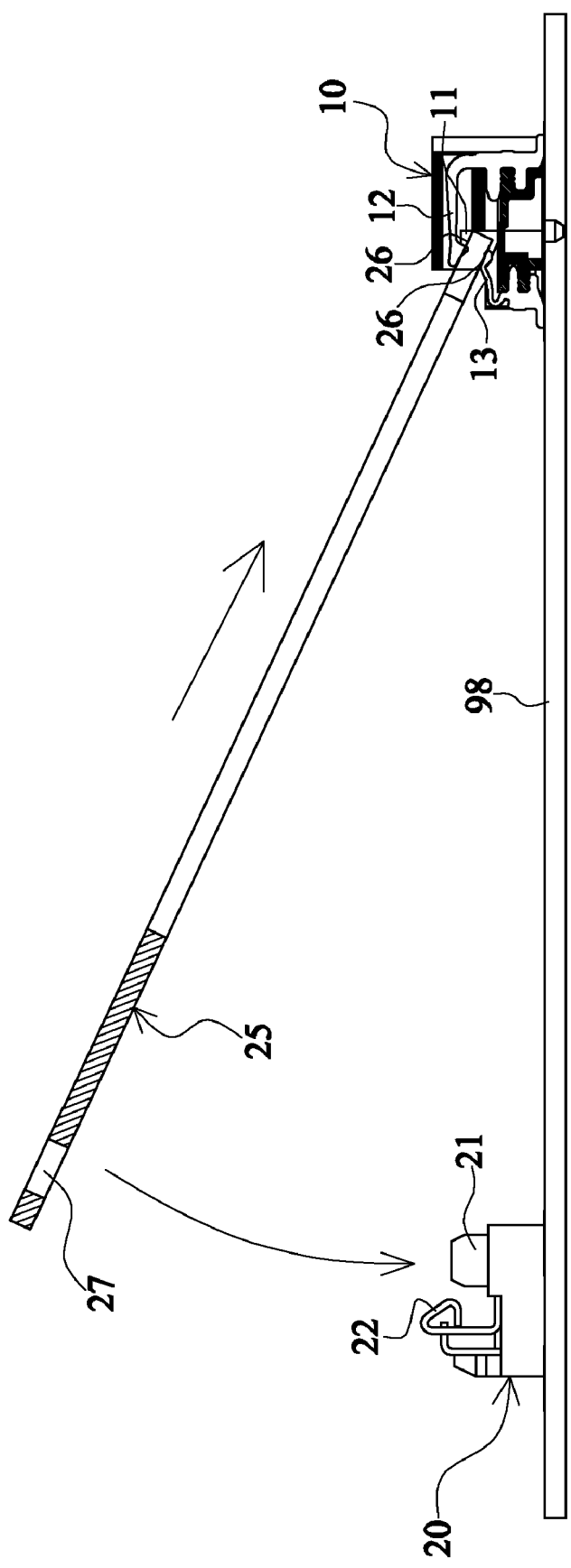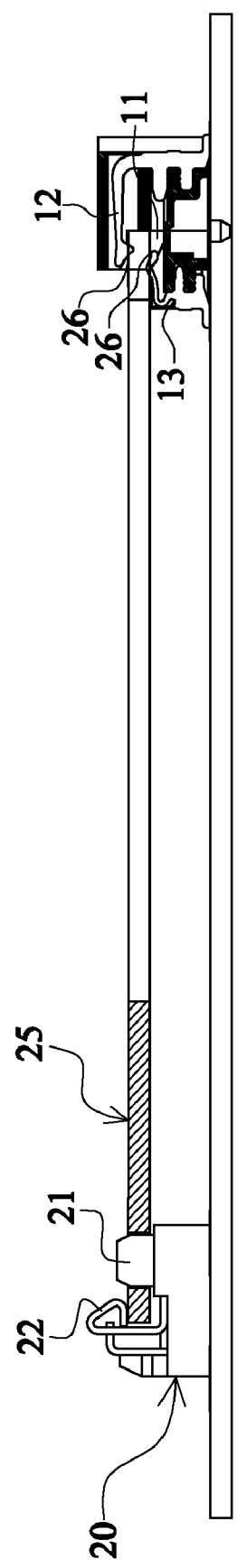
FIG. 1 (Prior Art)
FIG. 2 (Prior Art)

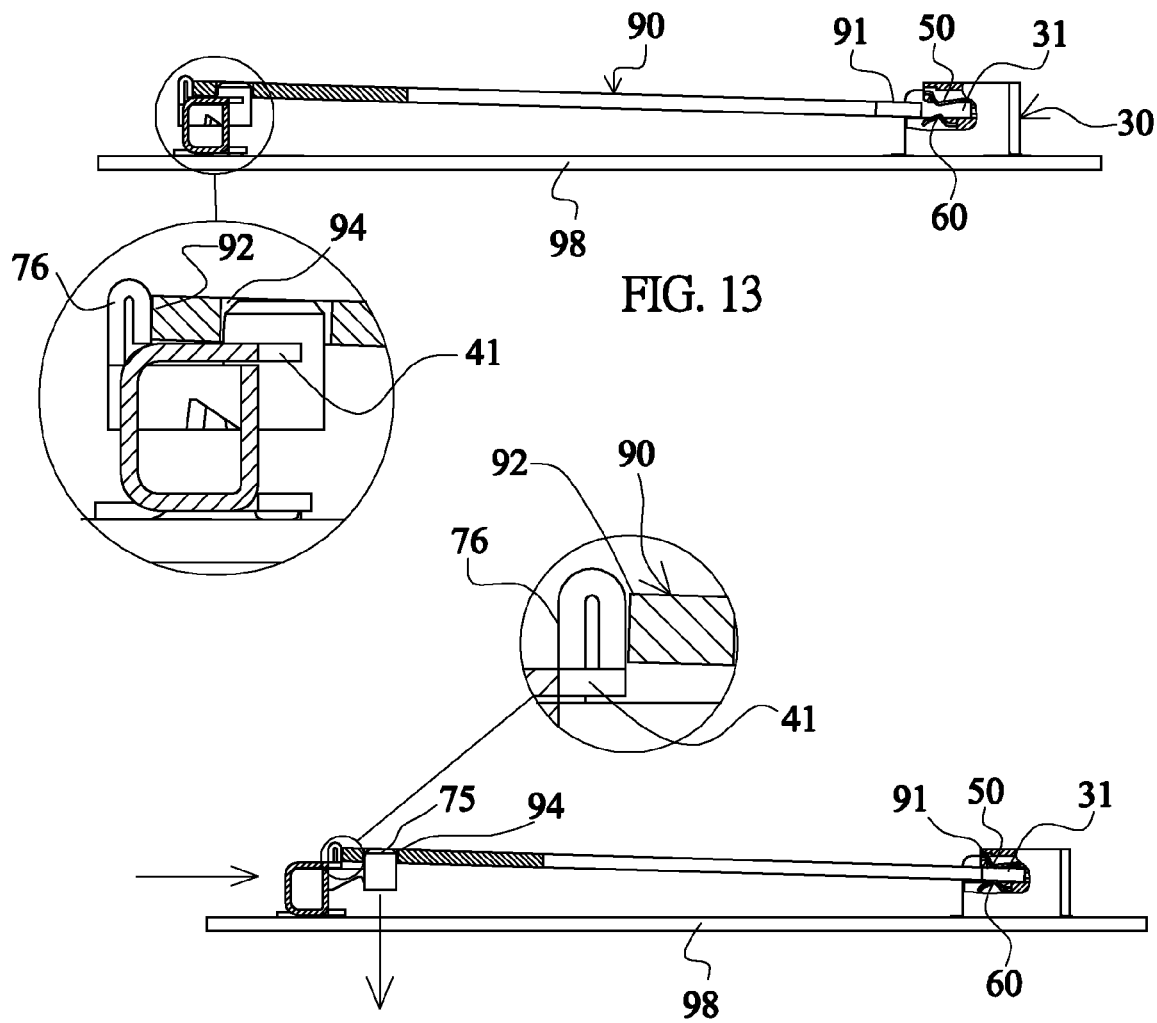
FIG. 13
FIG. 14
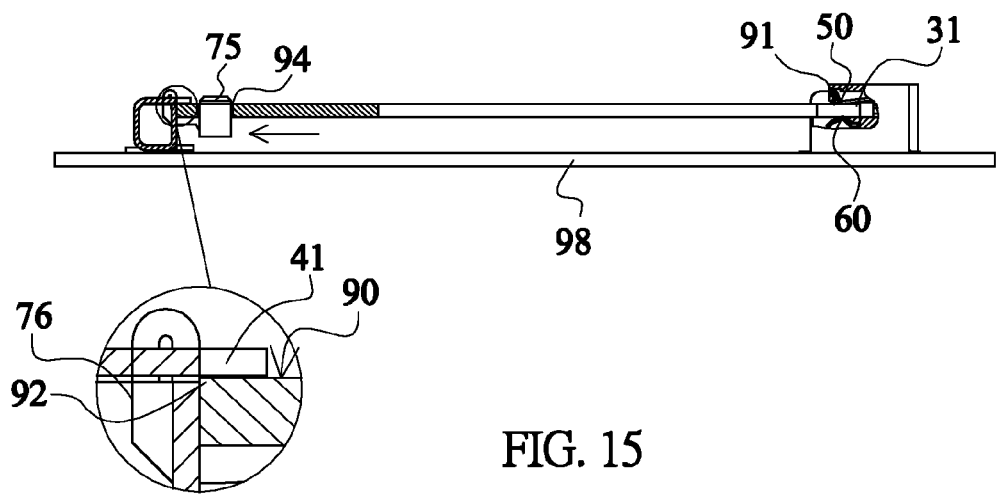
FIG. 15

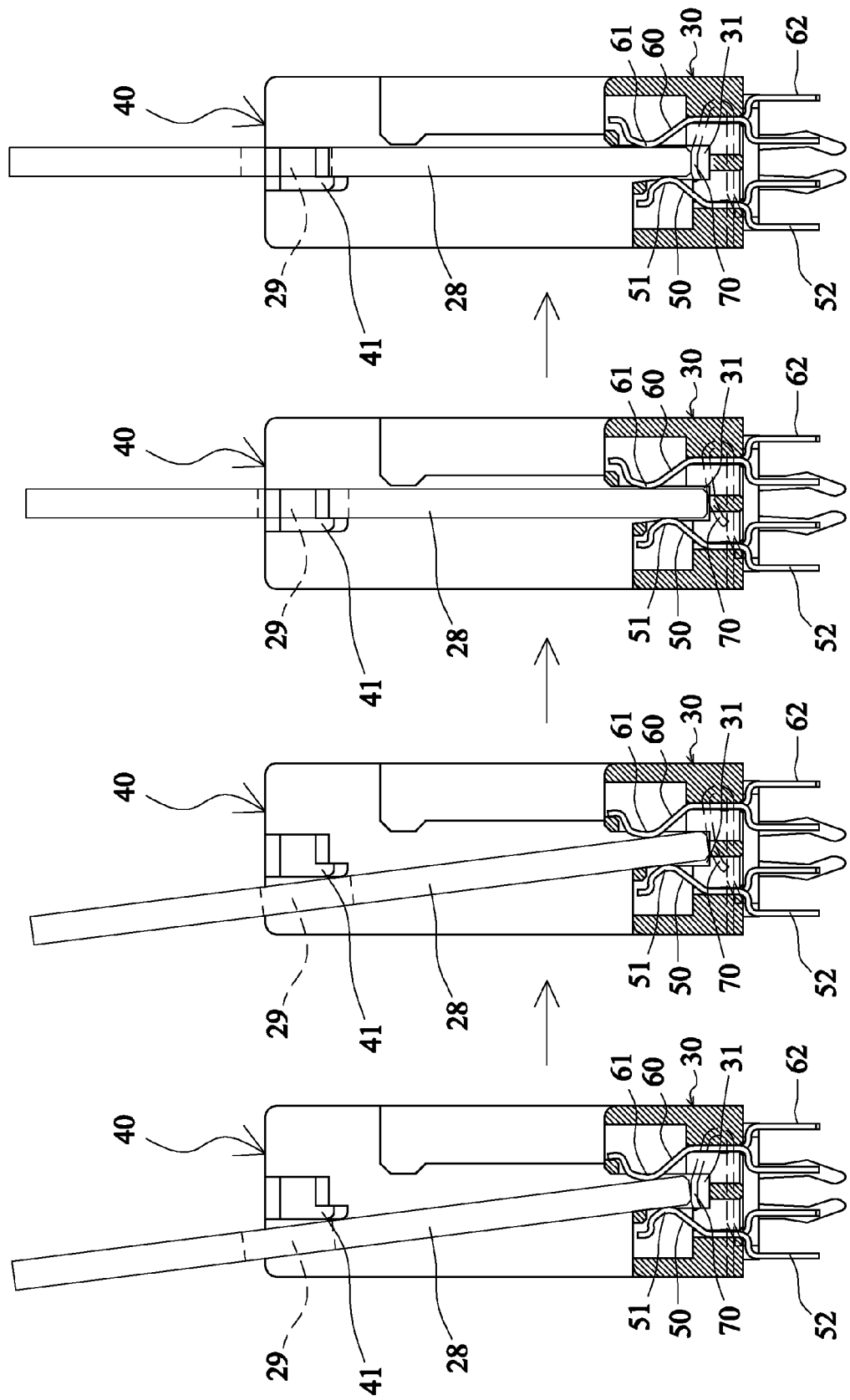

ELECTRICAL CONNECTOR HAVING ELASTIC CARD-EJECTING MEMBER

BACKGROUND OF THE INVENTION

1. Field of Invention

The invention relates to an electrical connector, and more particularly to an electrical connector connected to a circuit board.

2. Related Art

Referring to FIGS. 1 and 2, a conventional electrical connector assembly includes an electrical connector, a circuit board 25 and a main board 98.

The electrical connector has a plastic base 10 and a board engaging structure 20. The plastic base 10 had a slot 11 with an opening facing backwards, upper terminals 12 and lower terminals 13 are arranged in the slot 11 the plastic base 10 is fixed to the main board 98, and the upper terminals 12 and the lower terminals 13 respectively have pins electrically connected to the main board 98. The board engaging structure 20 is disposed in back of the plastic base 10 by a distance and fixed to the main board 98. The board engaging structure 20 has a positioning rod 21 and an elastic hook 22.

Upper and lower surfaces of the front end of the circuit board 25 are formed with connection points 26, and the rear end of the circuit board 25 is formed with an engagement hole 27.

When the circuit board 25 is to be connected to the connector, the connection points 26 at the front end of the circuit board 25 are slantingly inserted into the slot 11 of the electrical connector, and then the other end of the circuit board 25 is pressed down so that the positioning rod 21 is inserted into the engagement hole 27 of the circuit board 25 and the rear end of the circuit board 25 is engaged with the elastic hook 22.

The conventional structure has the following drawbacks.

First, the rear end of the circuit board 25 is elastically engaged with the elastic hook 22, and is thus not engaged very firmly because the elastic hook can be elastically opened. When the impact test is performed, the elastic hook 22 may be disengaged from the circuit board when the large impact force is applied.

Second, after the circuit board 25 is rotated to be horizontal, as shown in FIG. 2, the connection points 26 on the upper surface of the circuit board 25 are moved backwards, and the connection points 26 on the lower surface of the circuit board 25 are moved forwards. Thus, the oxidation layers on the connection points 26 on the upper surface of the circuit board 25 can be sufficiently scraped off (no wear occurs when the circuit board is inserted and moved forwards, and the wear occurs when the circuit board is rotated to be horizontal and then moved backwards), but the connection points 26 on the lower surface have no backward stroke and the wearing stroke of the horizontal motion is very short. So, the oxidation layers on the connection points 26 on the lower surface of the circuit board 25 and in contact with the lower terminals 13 cannot be sufficiently scraped off, and the electrical connection properties are poor.

SUMMARY OF THE INVENTION

It is therefore an object of the invention to provide an electrical connector, which is configured such that when a circuit board is inserted into and connected to the electrical connector, the inserted circuit board can be moved back by a stroke and then engaged. Thus, the oxidation layers on the connection points on two surfaces of the circuit board can be sufficiently scraped off, and the circuit board can be firmly engaged.

The invention achieves the above-identified object by providing an electrical connector to be disposed on a main board and to be connected to and engaged with a circuit board. The electrical connector includes a plastic base, terminals, a board engaging structure and at least one elastic card-ejecting member. The plastic base is fixed to the main board and formed with a connection slot. The connection slot has an opening, and one end of the circuit board may be inserted into and connected to the opening. The terminals are disposed on the plastic base, and each of the terminals has a projecting connection point disposed on the connection slot. The board engaging structure has at least one engaging portion, which can engage with the circuit board when the circuit board is inserted into the connection slot for positioning. The elastic card-ejecting member enters a forced state when the one end of the circuit board is inserted into the connection slot by a stroke, and pushes the circuit board out by another stroke so that the circuit board is engaged with the engaging portion when the elastic card-ejecting member bounces.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

FIG. 1 is a side view showing a conventional electrical connector and a circuit board slantingly inserted into an electrical connector.

FIG. 2 is a side view showing the circuit board engaged with the conventional electrical connector.

FIGS. 13 to 15 are side views showing used states of the electrical connector according to the third embodiment of the invention.

FIGS. 26 to 30 are cross-sectional side views showing used states of an electrical connector according to a seventh embodiment of the invention.

DETAILED DESCRIPTION OF THE INVENTION

The present invention will be apparent from the following detailed description, which proceeds with reference to the accompanying drawings, wherein the same references relate to the same elements.

Figure 3:
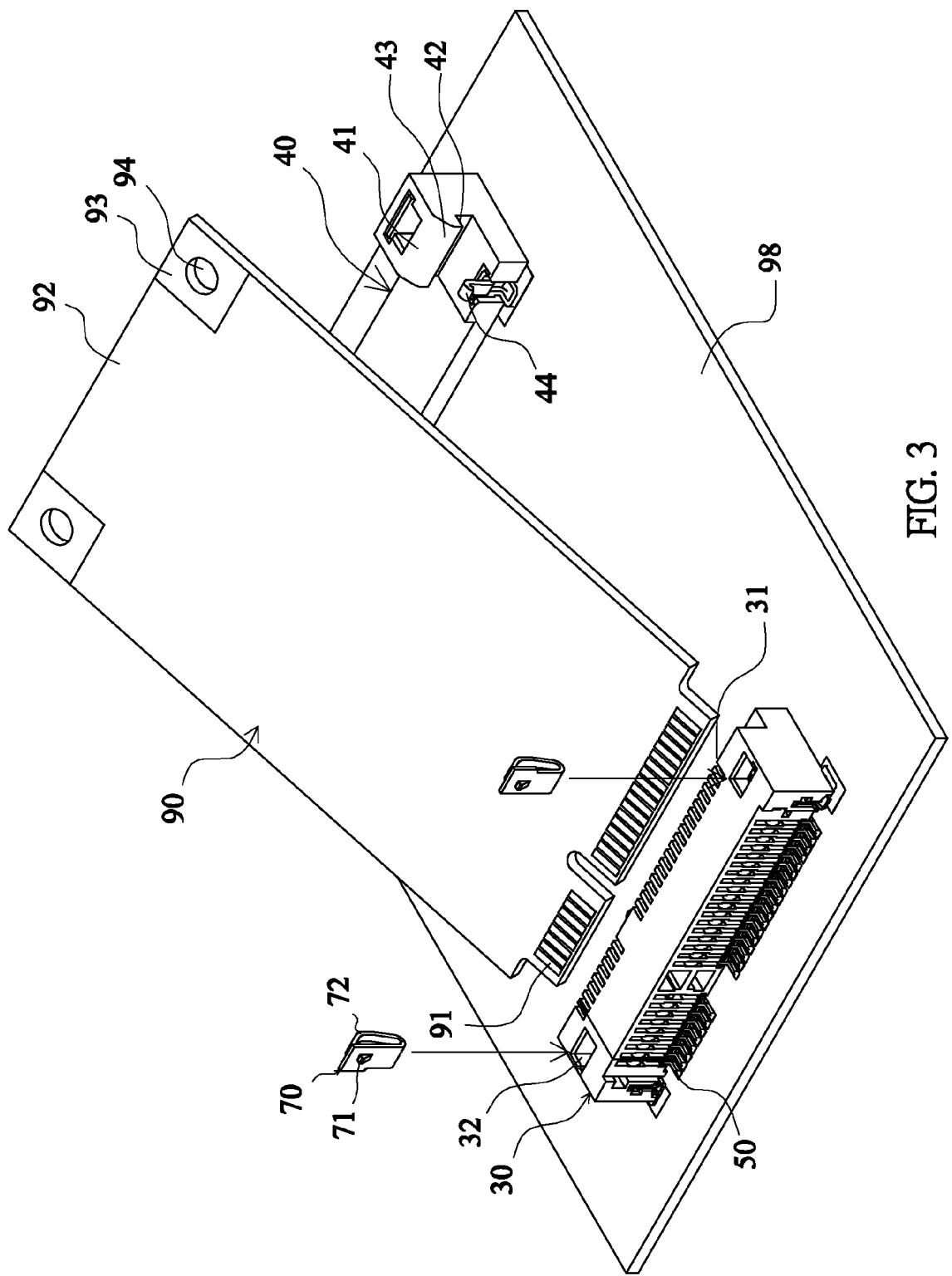
FIG. 3 is a pictorially exploded view showing an electrical connector according to a first embodiment of the invention.
Figure 4:
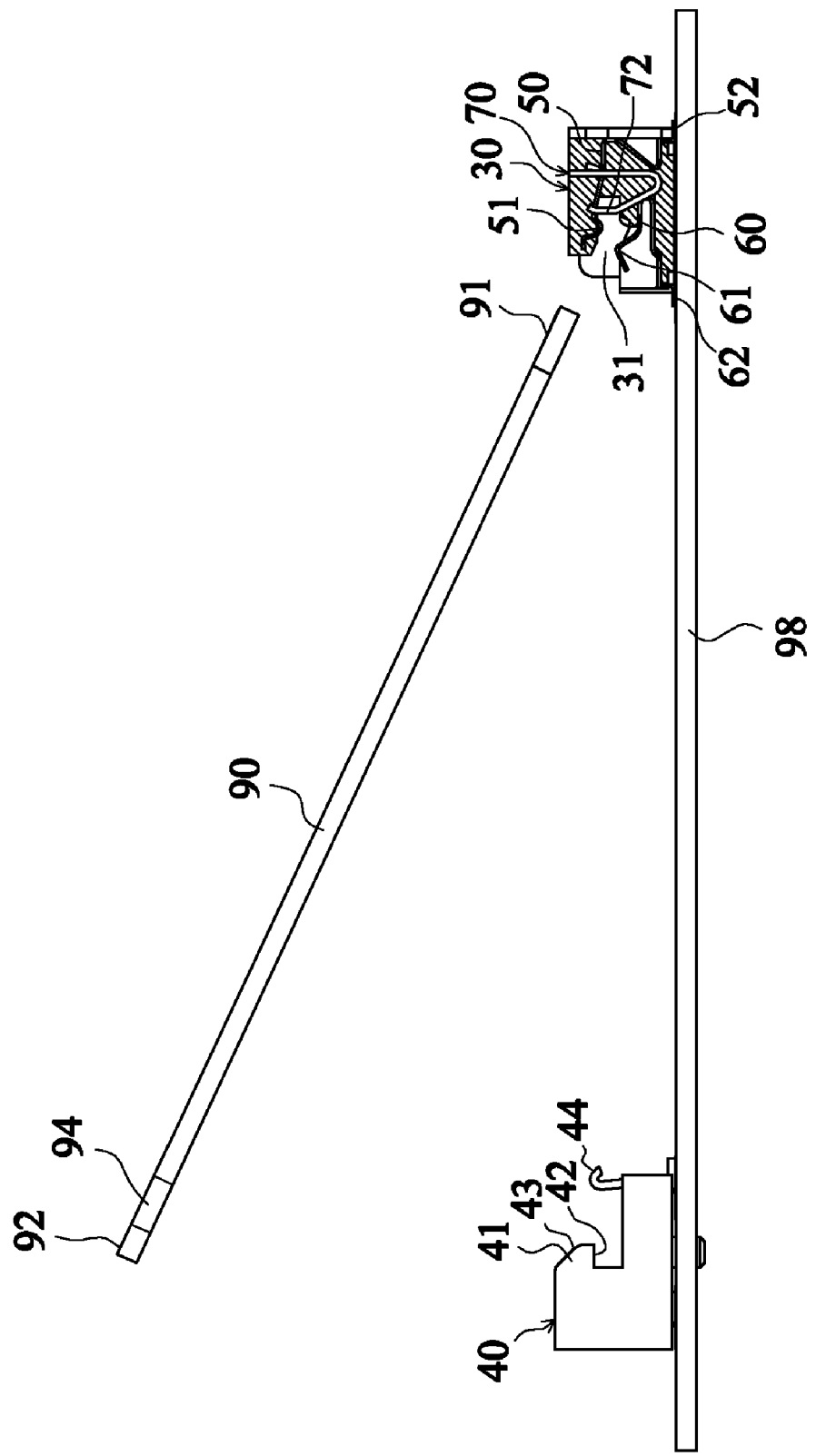
FIG. 4 is an exploded side view showing the electrical connector according to the first embodiment of the invention.

As shown in FIGS. 3 and 4, the electrical connector of this embodiment is disposed on a main board 98 and is to be connected to and engaged with a circuit board 90. The electrical connector includes a plastic base 30, a row of first terminals 50, a row of second terminals 60, a board engaging structure 40 and two elastic card-ejecting members 70. Two surfaces of a front end of the circuit board 90 are formed with connection points 91, each of two sides of a rear end 92 is formed with an electroconductive region 93, and the electroconductive region 93 is formed with a through hole 94.

The plastic base 30 is stationarily fixed to the main board 98 and has a connection slot 31 with an opening facing frontwards. The front end of the circuit board 90 may be inserted into and connected to the connection slot 31. Each of two sides of the connection slot 31 is formed with an elastic card-ejecting member slot 32 communicating with the connection slot 31.

The row of first terminals 50 and the row of second terminals 60 are separately arranged on the plastic base 30. The second terminal 60 has a connection point 61 projecting upwards. The first terminal 50 has a connection point 51, which projects downwards and is located in front of and above the connection point 61 of the second terminal so that an upward ejecting force for ejecting the circuit board 90 can be provided. The connection points 51 and 61 are disposed on the connection slot 31. The first terminals 50 and the second terminal 60 respectively have horizontal pins 52 and 62 electrically connected to the main board 98.

The two elastic card-ejecting members 70 are assembled with the elastic card-ejecting member slots 32 on two sides of the plastic base 30 and form a U shape. One end of the elastic card-ejecting member 70 is formed with an inverse hook 71 for hooking the plastic base, and the other end of the elastic card-ejecting member 70 is a force receiving end 72 disposed on the connection slot 31. The inserted circuit board 90 compresses the force receiving end 72 of the elastic card-ejecting member 70.

The board engaging structure 40 is disposed in back of the plastic base 30 by a distance and is fixed to the main board 98. An engaging portion 41 and a grounding hooking sheet 44 are disposed on each of two sides of the board engaging structure 40. The engaging portion 41 has a slanting guide surface 43 and a horizontal engaging surface 42. When the circuit board 90 is inserted into the connection slot 31 for positioning, the two engaging portions 41 can engage with the rear end 92 of the circuit board, and the grounding hooking sheet 44 can penetrate through the through hole 94 and hook the electroconductive region 93.

Figure 5:
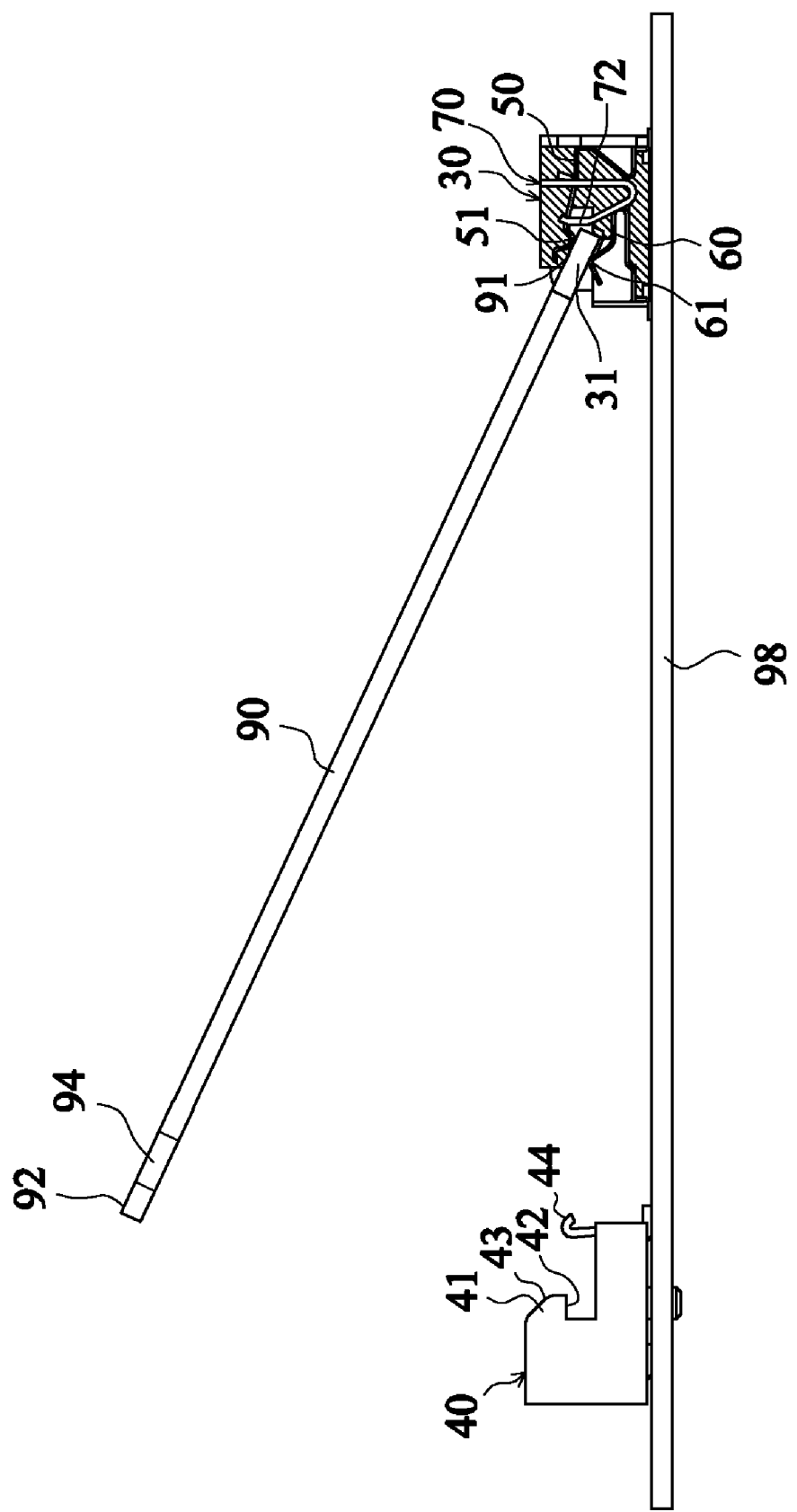
FIGS. 5 to 8 are side views showing used states of the electrical connector according to the first embodiment of the invention.
Figure 6:
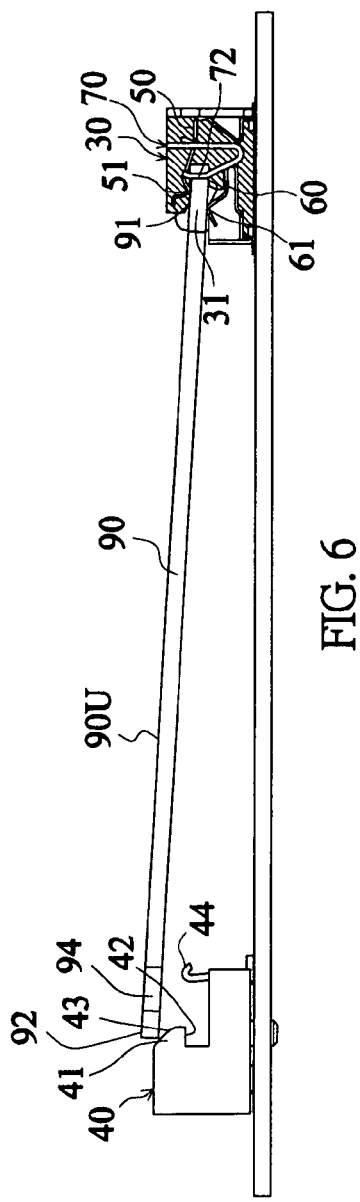
Figure 7:
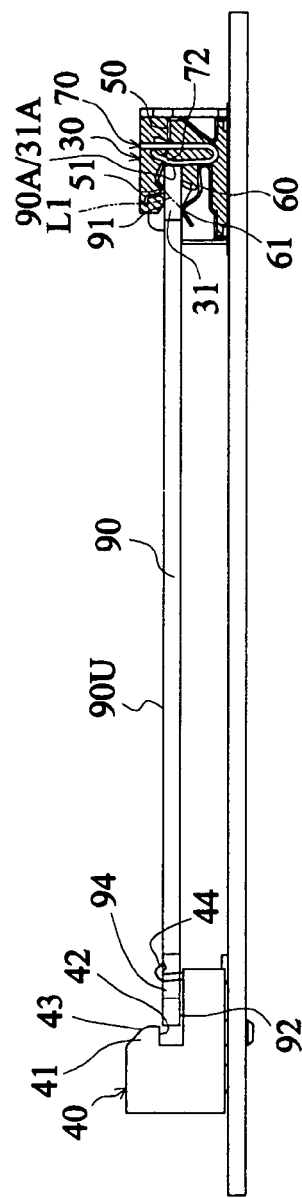
Figure 8:
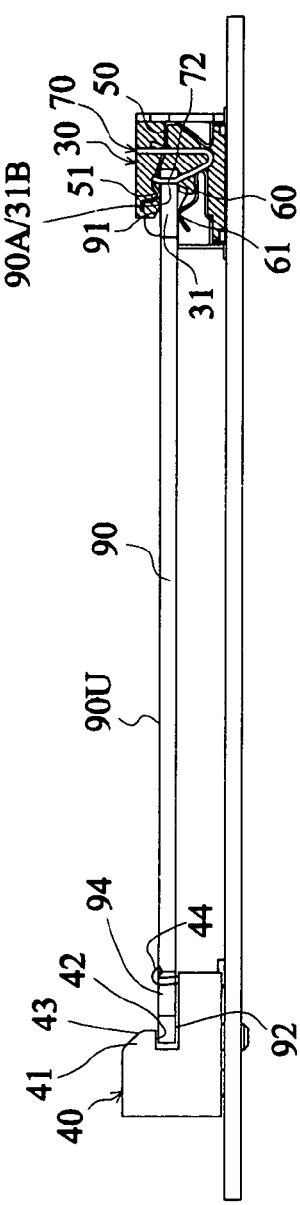

The operation of use will be described in the following. As shown in FIGS. 7 and 8, the connection slot 31 is provided with a first point 31A and a second point 31B distant from the first point 31A. As shown in FIG. 5, the circuit board 90 is slantingly inserted into the connection slot 31, At this time, the connection point 91 only slightly contacts with the first terminal 50 and the second terminal 60, and the circuit board 90 has not yet compressed the elastic card-ejecting member 70. As shown in FIG. 6, the circuit board 90 is pressed down to rest against the two engaging portions 41 of the board engaging structure 40. At this time, the connection point 91 is elastically pressed by the first terminal 50 and the second terminal 60, As shown in FIG. 7, when the circuit board 90 is further pressed down, one end 92 thereof is pressed along the slanting guide surface 43 of the engaging portion 41 so that the circuit board 90 is further inserted by a stroke and thus reaches the first point 31A of the connection slot 31. At this time, the circuit board 90 compresses the force receiving end 72 of the elastic card-ejecting member 70. As shown in FIG. 7, a line L1 connecting the connection point 51 of the first terminal 50 to the connection point 61 of the second terminal 60 is not perpendicular to an upper surface 90U of the circuit board 90. As shown in FIG. 8, when the circuit board 90 is released, the elastic card-ejecting member 70 bounces to push the circuit board 90 by another stroke. At this time, the rear end 92 of the circuit board 90 is engaged by the engaging surface 42 of the engaging portion 41. In this state, the one end 90A of the circuit board 90 is located at the second point 31B of the connection slot 31, and the other end 92 of the circuit board 90 is disposed outside the plastic base 30 and is engaged by the engaging portion 41.

When the circuit board 90 is to be taken, it is only necessary to push the circuit board 90 by a stroke toward the connection slot 31 to make the rear end 92 of the circuit board 90 escape from the engaging portion 41 of the board engaging structure 40.

Accordingly, the invention has the following advantages.

First, the circuit board 90 is pushed and ejected by the stroke so that oxidation layers on the first and second terminals 50 and 60 on two surfaces of the connection points 91 can be scraped off and the good electrical connection properties can be obtained.

Second, the circuit board 90 is horizontally ejected by the stroke so that the one end thereof can be engaged with the engaging portion 41 of the board engaging structure 40 and the engaging portion 41 cannot be elastically moved, and the circuit board 90 can be firmly engaged.

Figure 10:
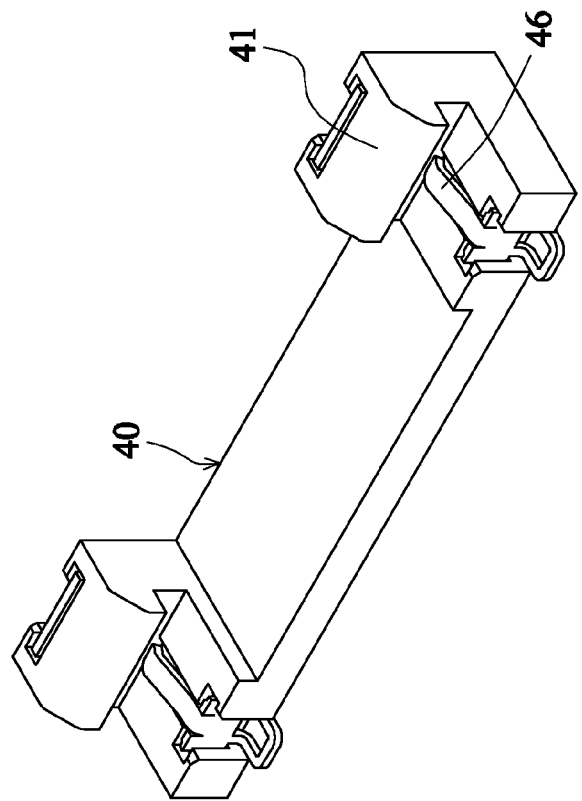
FIG. 10 is a pictorially assembled view showing the electrical connector according to the second embodiment of the invention.
Figure 9:
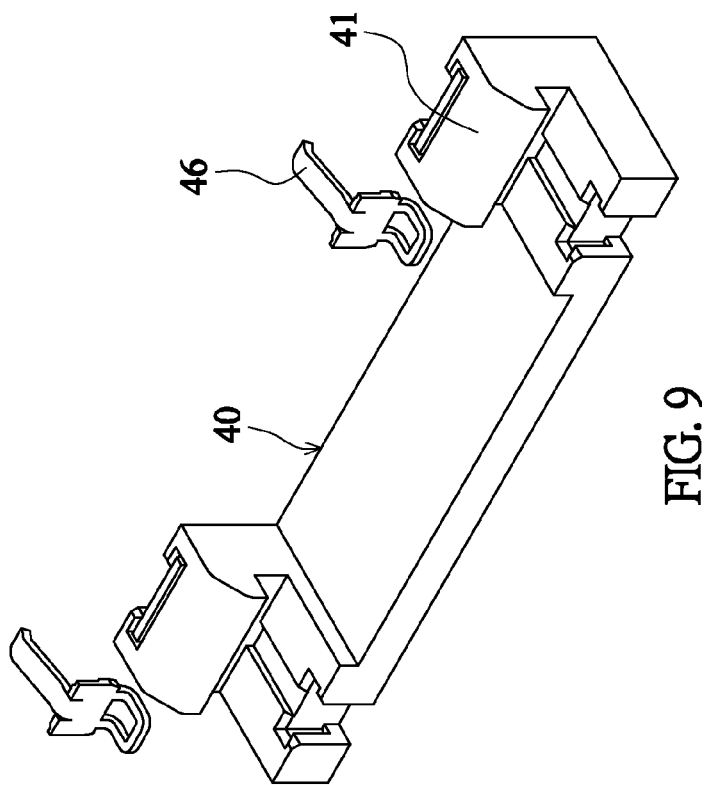
FIG. 9 is a pictorially exploded view showing an electrical connector according to a second embodiment of the invention.

As shown in FIGS. 9 and 10, the second embodiment of the invention is almost the same as the first embodiment except that the board engaging structure 40 has an elastic grounding sheet 46. When one end of the circuit board is engaged with the engaging portion 41, the electroconductive region of the circuit board may be connected to the elastic grounding sheet 46. When the rear end of the circuit board is disengaged from the engaging portion 41, the elastic grounding sheet 46 can increase the upward bouncing force for bouncing the circuit board.

Figure 11:
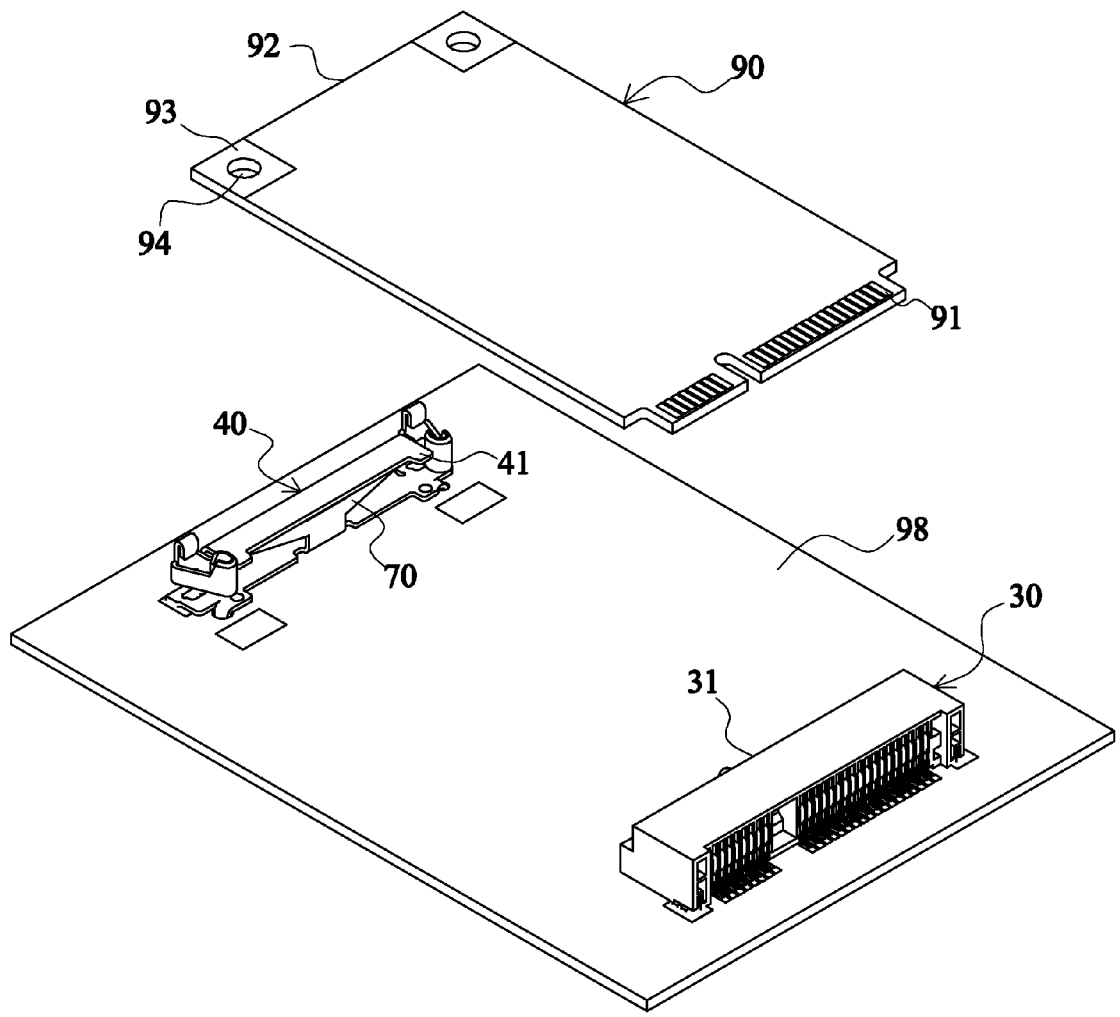
FIG. 11 is a pictorially exploded view showing an electrical connector according to a third embodiment of the invention.
Figure 12:
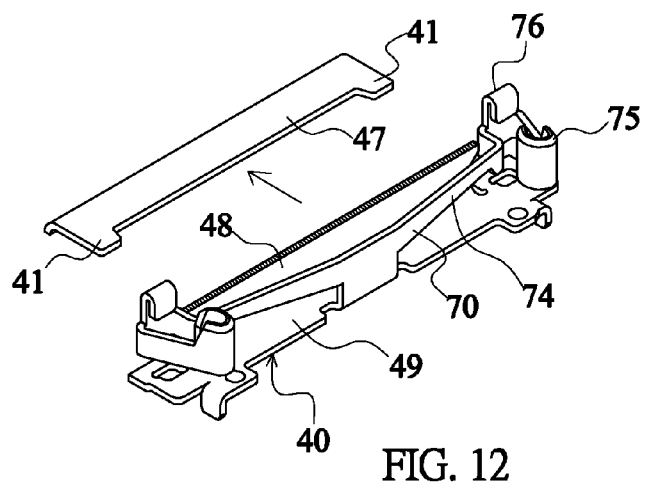
FIG. 12 is a pictorial view showing the elastic card-ejecting member and the board engaging structure according to the third embodiment of the invention.

As shown in FIGS. 11 to 13, the electrical connector according to the third embodiment of the invention is disposed on a main board 98 and to be connected to and engaged with a circuit board 90. The electrical connector includes a plastic base 30, a row of first terminals 50, a row of second terminals 60, a board engaging structure 40 and an elastic card-ejecting member 70.

Two surfaces of a front end of the circuit board 90 are formed with connection points 91, and two sides of a rear end 92 are formed with electroconductive regions 93. The electroconductive region 93 is formed with a through hole 94.

The plastic base 30 is fixed to the main board 98 and has a connection slot 31 with an opening facing backwards. The front end of the circuit board 90 may be inserted into and connected to the connection slot 31.

The row of first terminals 50 and the row of second terminals 60 are separately arranged on the plastic base 30. The second terminals 60 have connection points 61 projecting upwards, and the first terminals 50 have connection points 51 projecting downwards.

The elastic card-ejecting member 70 and the board engaging structure 40 are integrally formed and fixed to the main board 98 located in front of the plastic base 30 by a distance. The board engaging structure 40 has a top plate 47, a rear plate 48 and a bottom plate 49, and substantially has a ⊏ shape. Each of two sides of the top plate 47 is formed with a projecting engaging portion 41. The elastic card-ejecting member 70 is connected to the middle of the front end of the bottom plate 49, and has two elastic arms 74 extending toward two sides. A distal end of each elastic arm 74 is formed with a hand pushing portion 76 and a positioning rod 75 projecting upwards.

The operations will be described in the following. As shown in FIG. 13, the two positioning rods 75 are inserted into the two through holes 94 at the rear end of the circuit board 90. At this time, the connection points 91 at the front end of the circuit board 90 are aligned with the connection slots 31 of the electrical connector. As shown in FIG. 14, when the finger pushes the hand pushing portion 76 to insert the circuit board 90 into the bottom of the connection slot 31, the other end 92 of the circuit board 90 has escaped from the engaging portion 41 so that the circuit board 90 can be smoothly pressed down. As shown in FIG. 15, when the hand releases the circuit board, the resilience of the elastic card-ejecting member bounces the circuit board 90 to horizontally eject by a stroke from the connection slot 31 of the electrical connector. When the circuit board 90 is ejected by the stroke, the oxidation layers on the connection points 91 on two surfaces thereof can be again scraped off by the first and second terminals 50 and 60. At this time, the rear end 92 of the circuit board 90 is engaged with the engaging portion 41.

When the circuit board is to be taken out, the hand pushing portion 76 is pushed forwards to insert the circuit board 90 into the connection slot 31 by a stroke, and the rear end 92 of the circuit board 90 escapes from the engaging portion 41 of the board engaging structure.

Figure 16:
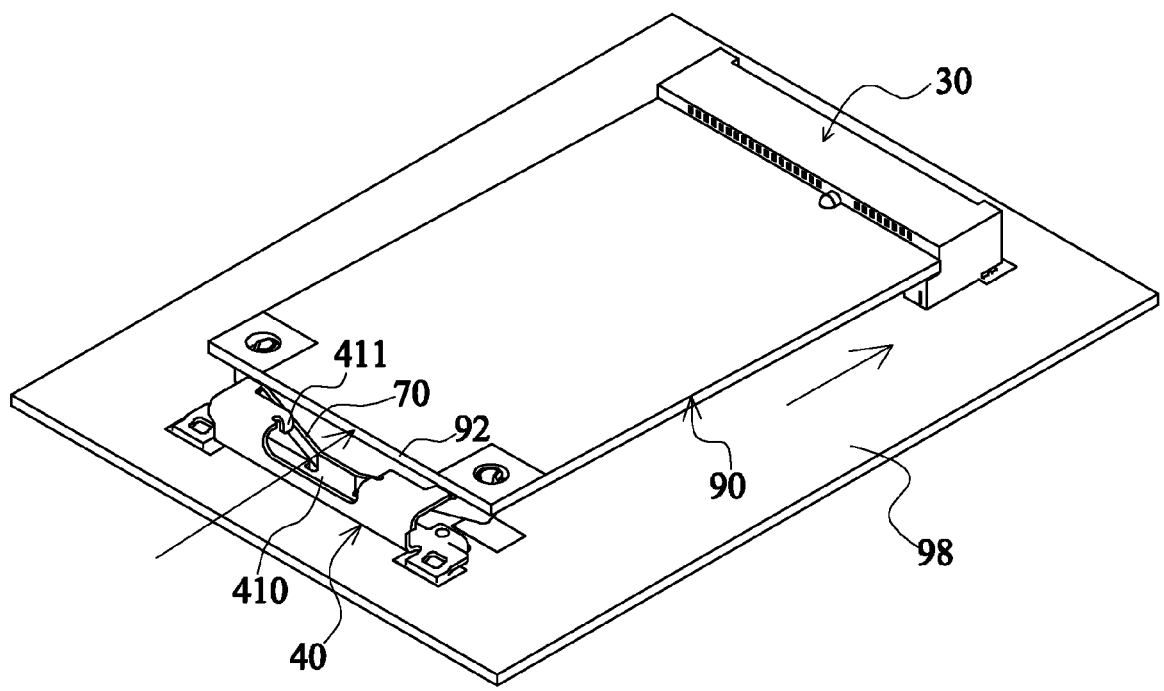
FIG. 16 is a pictorial view showing a used state of an electrical connector according to a fourth embodiment of the invention.
Figure 17:
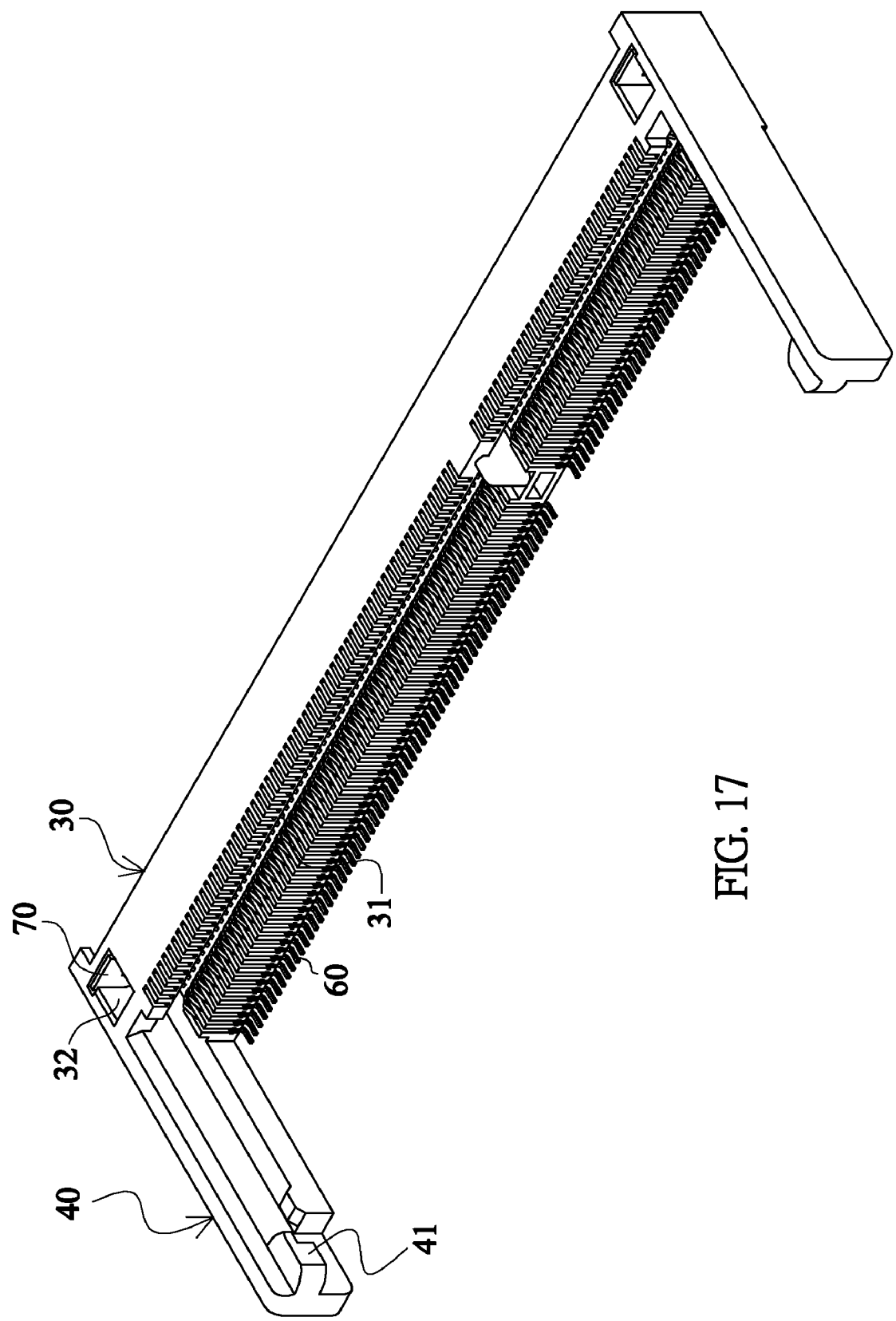
FIG. 17 is a pictorial view showing an electrical connector according to a fifth embodiment of the invention.
Figure 18:
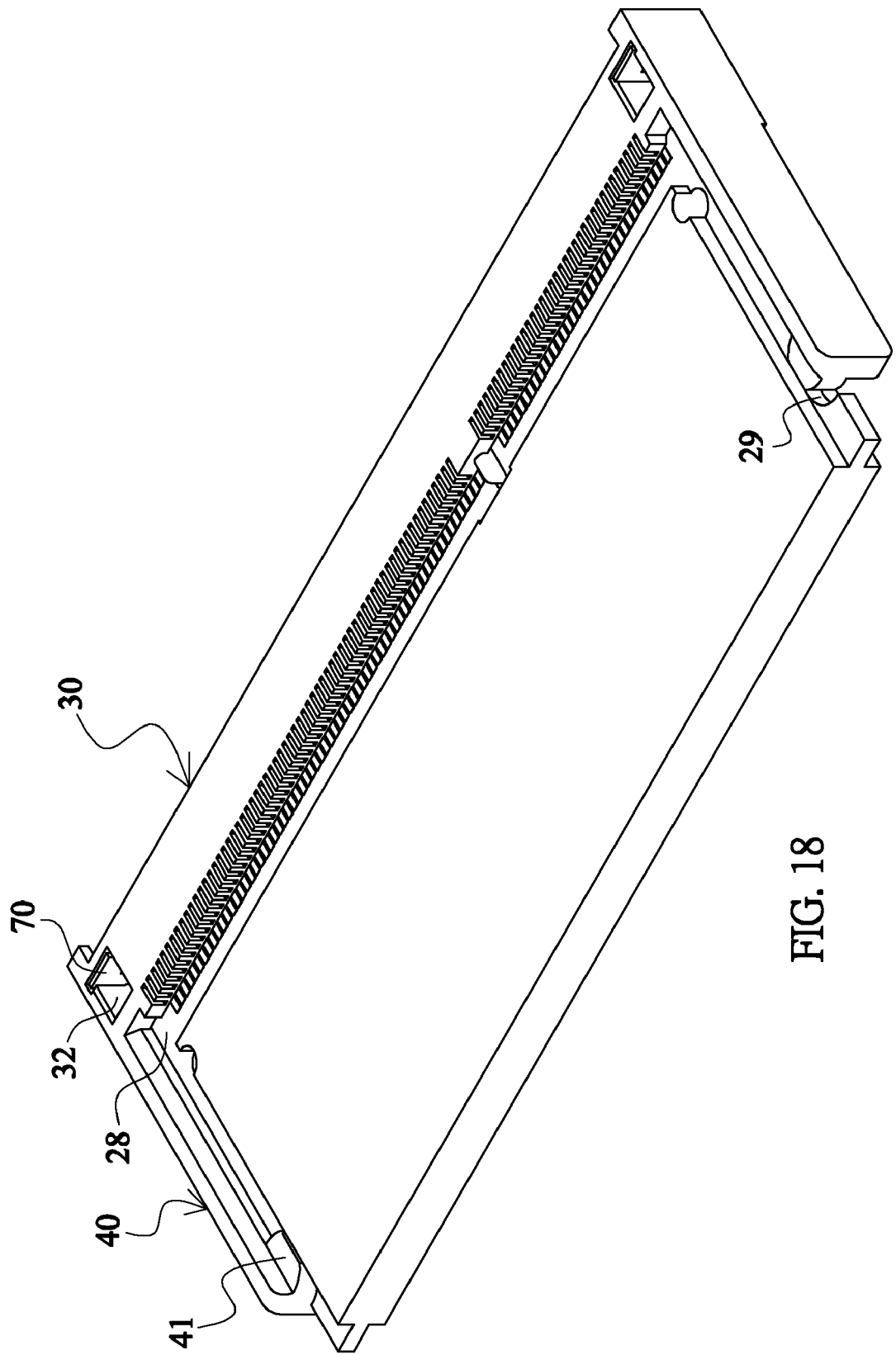
FIG. 18 is a pictorial view showing the electrical connector connected to the circuit board according to the fifth embodiment of the invention.

As shown in FIG. 16, the fourth embodiment is almost the same as the third embodiment except that a notch 410 is formed between the rear plate and the top plate of the board engaging structure 40 so that the hand can directly push the rear end 92 of the circuit board 90 conveniently. In order to facilitate the manufacturing of the connector, no hand pushing portion is provided in this embodiment, and the user only can directly push the circuit board via the notch 410. In addition, in order to leave the larger space to facilitate the user to push the circuit board, the elastic card-ejecting member 70 is lower than that of the third embodiment, and two stopper plates 411 are formed on two sides of the notch 410 by bending the top plate downwards so that the stopper plates 411 can stop the circuit board 90 ejected back.

As shown in FIGS. 17 to 20, the electrical connector according to the fifth embodiment of the invention is to be connected to a circuit board 28 and engaged with two lateral sides of the circuit board 28. The electrical connector includes a plastic base 30, a board engaging structure 40, a row of first terminals 50, a row of second terminals 60 and two elastic card-ejecting members 70.

Each of two sides of the circuit board 28 is formed with a semi-circular notch 29.

The plastic base 30 has a connection slot 31 with an opening facing backwards. The circuit board 28 may be inserted into and connected to the connection slot 31. Each of two sides of the connection slot 31 is formed with an elastic card-ejecting member slot 32, which communicates with the connection slot 31 and is formed with an opening 33 at a front end thereof.

The board engaging structure 40 has two lateral arms, which are integrally formed on two sides of the plastic base 30 by way of injection molding, and extend toward the rear end of the plastic base 30. An engaging portion 41 is disposed near an outer end of each of the lateral arms. A rib 412 is integrally formed with an inner-side lower edge of each of the two lateral arms. The rib 412 extends form the plastic base to the outer end of the lateral arm. The rib 412 has a supporting projection 413. When the circuit board 28 is inserted into the connection slot 31 for positioning, it can be supported by the rib 412, and the engaging portion 41 can engage with one side of the circuit board 28.

The row of first terminals 50 and the row of second terminals 60 are separately arranged on the plastic base 30. The second terminals 60 have connection points 61 projecting upwards, and the first terminals 50 have connection points 51, which project downwards and are located in front of and above the connection points 61 of the second terminals to provide the upward ejecting force for bouncing the circuit board 28.

The two elastic card-ejecting members 70 are assembled with the elastic card-ejecting member slots 32 on two sides of the plastic base 30, and form the U shape. One end of the elastic card-ejecting member 70 is formed with an inverse hook 71 for hooking the opening 33, and the other end of the elastic card-ejecting member 70 is a force receiving end 72 disposed on the connection slot 31. The inserted circuit board 90 compresses the elastic card-ejecting member 70. When the elastic card-ejecting member 70 bounces to push the circuit board 28 out by a stroke, the circuit board 28 may be engaged with the engaging portion 41.

Figure 19:
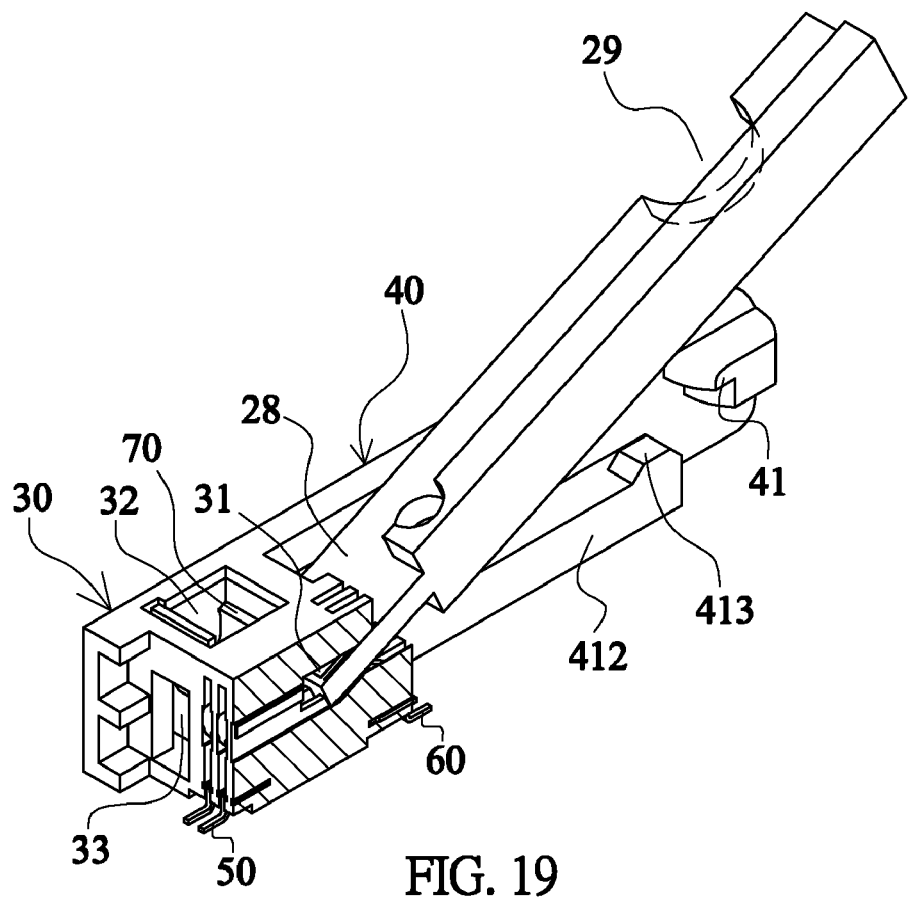
FIG. 19 is a pictorially cross-sectional view showing the used state of the electrical connector according to the fifth embodiment of the invention.
Figure 20:
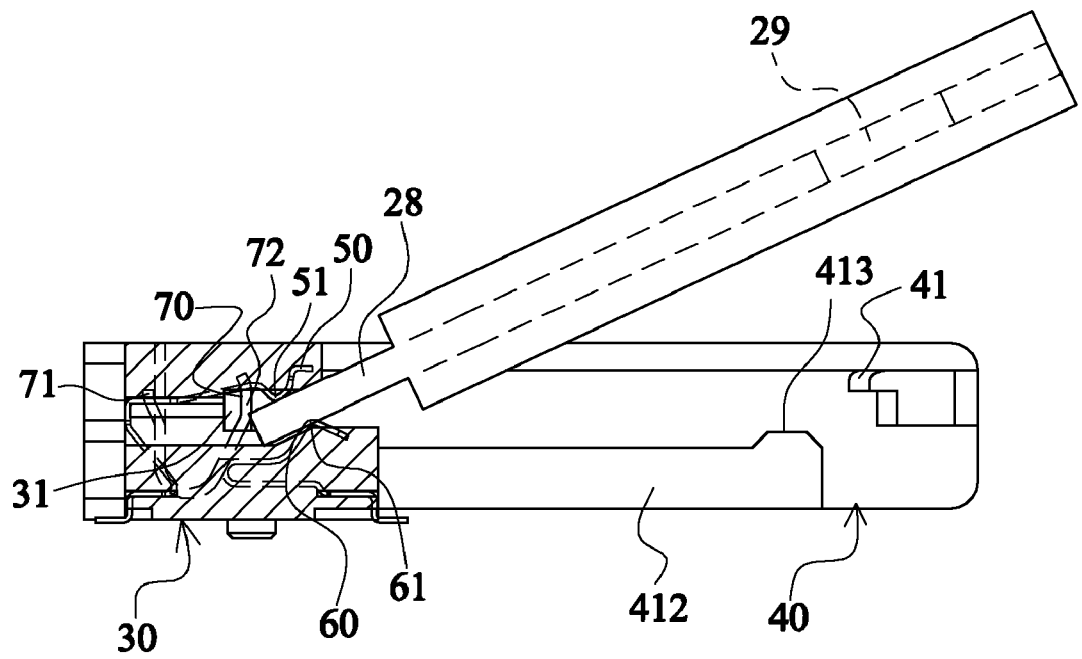
FIGS. 20 to 24 are cross-sectional side views showing the used states of the electrical connector according to the fifth embodiment of the invention.
Figure 21:
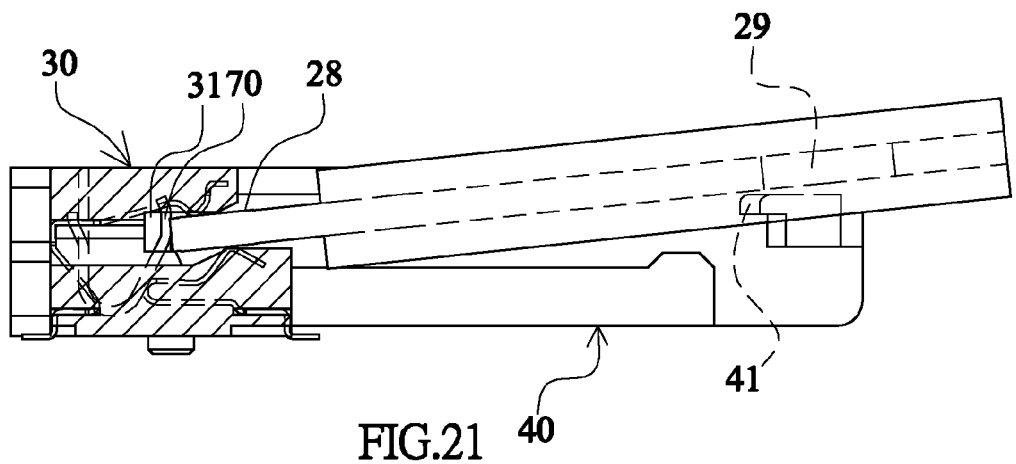
Figure 22:
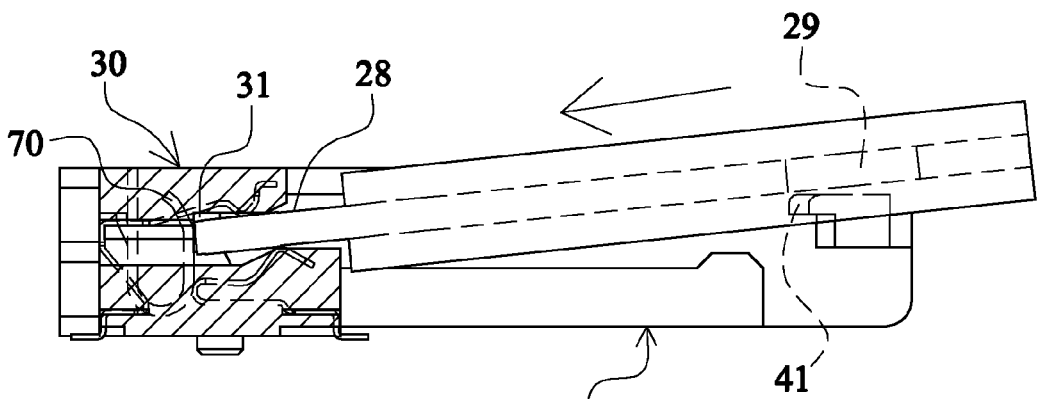
Figure 23:
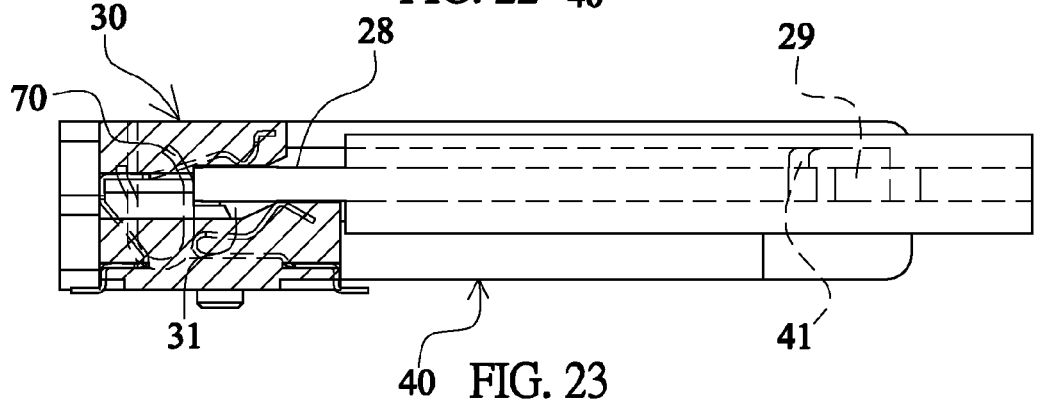
Figure 24:
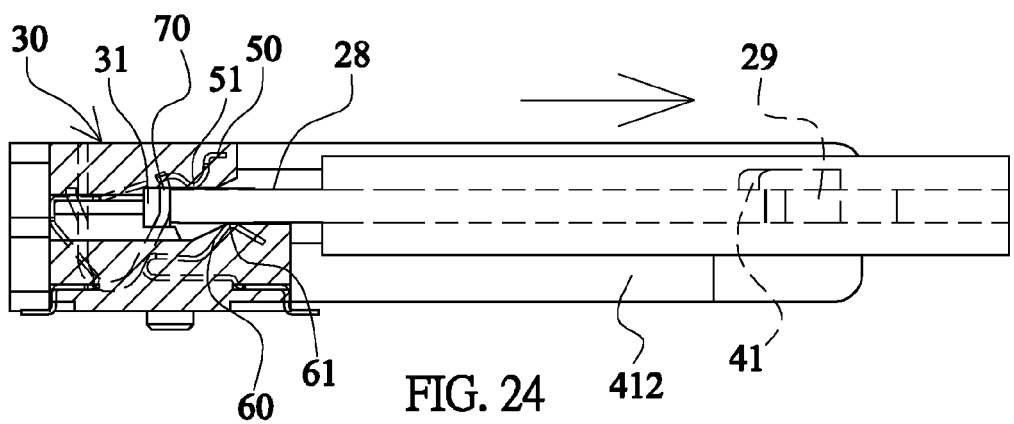

The operations will be described in the following. As shown in FIGS. 19 and 20, the circuit board 28 is slantingly inserted into the connection slot 31. At this time, the connection points of the circuit board only slightly contact with the first terminals 50 and the second terminals 60 and have not yet compressed the elastic card-ejecting member 70. As shown in FIG. 21, the circuit board 28 is then pressed down to rest against the engaging portion 41 of the board engaging structure 40. At this time, the connection points of the circuit board are elastically pressed by the first terminals 50 and the second terminals 60. As shown in FIG. 22, the circuit board 28 is then pushed by a stroke toward the connection slot 31. At this time, the elastic card-ejecting member 70 is compressed by the circuit board 28. When the notch 29 of the circuit board 28 corresponds to the engaging portion 41, the circuit board 28 may be pressed to be horizontal, as shown in FIG. 23. As shown in FIG. 24, when the elastic card-ejecting member 70 bounces to push the circuit board 28 out by a stroke, two sides of the circuit board 28 can be engaged with the two engaging portions 41 while the circuit board 28 is supported by the rib 412.

When the circuit board 28 is to be taken out, it is only necessary to push the circuit board 28 inwardly toward the connection slot 31. When the notches 29 on two sides of the circuit board 28 correspond to the engaging portions 41 of the board engaging structure 40, the circuit board is disengaged from the engaging portions 41. At this time, the connection points 51 of the first terminals 50 are in back of the connection points 61 of the second terminals 60 so that the resilience for bouncing the circuit board 28 upwards can be provided.

Figure 25:
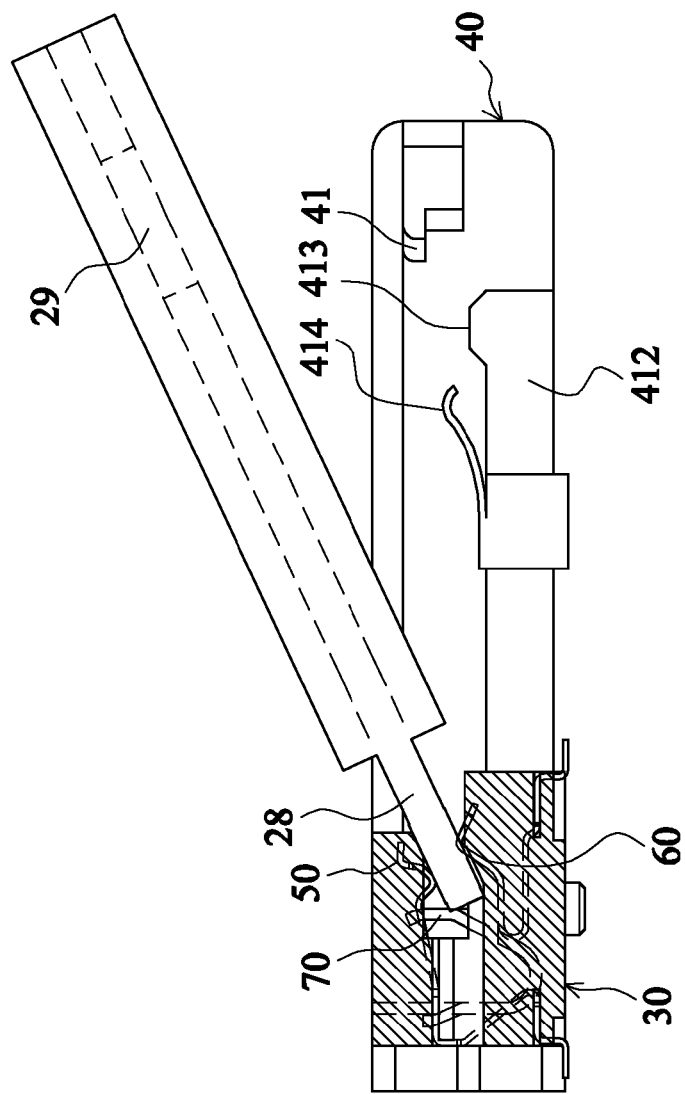
FIG. 25 is a cross-sectional side view showing a used state of an electrical connector according to a sixth embodiment of the invention.

As shown in FIG. 25, the sixth embodiment is almost the same as the fifth embodiment except that the rib 412 of the sixth embodiment is formed with an elastic sheet 414 for elastically pressing the circuit board 28. When the circuit board 28 is disengaged from the engaging portion 41, the resilience of the elastic sheet 414 can increase the ejecting force.

As shown in FIG. 26, the seventh embodiment is almost the same as the fifth embodiment. Similarly, the electrical connector includes a plastic base 30, a board engaging structure 40, a row of first terminals 50, a row of second terminals 60 and two elastic card-ejecting members 70. The difference between the seventh and fifth embodiments is that the plastic base 30 of the seventh embodiment is an upright plastic base. That is, the plastic base 30 has a connection slot 31 with an opening facing upwards. The row of first terminals 50 and the row of second terminals 60 are disposed on two sides of the connection slot 31. The connection points 51 of the first terminals 50 are lower than the connection points 61 of the second terminals 60, and the first terminals 50 and the second terminals 60 respectively have longitudinal pins 52 and longitudinal pins 62.

The operations will be described in the following. As shown in FIG. 26, when the circuit board 28 is slantingly inserted into the connection slot 31, the circuit board 28 rests against the engaging portion 41 of the board engaging structure 40. As shown in FIG. 27, the circuit board 28 is then pressed down to move by a stroke toward the connection slot 31. At this time, the elastic card-ejecting member 70 is compressed by the circuit board 28. As shown in FIG. 28, when the notch 29 of the circuit board 28 corresponds to the engaging portion 41, the circuit board 28 can be rotated to be vertical. As shown in FIG. 29, when the elastic card-ejecting member 70 bounces to push the circuit board 28 out by a stroke, the two sides of the circuit board 28 may be engaged with the two engaging portions 41.

The main object of providing the upright plastic base 30 is to reduce the planner space occupied by the connector. Because the board engaging structure 40 of this invention is fixed the board engaging structure 40 is not forced during the operation so that the plastic base 30 cannot become unstable.

Figure 30:
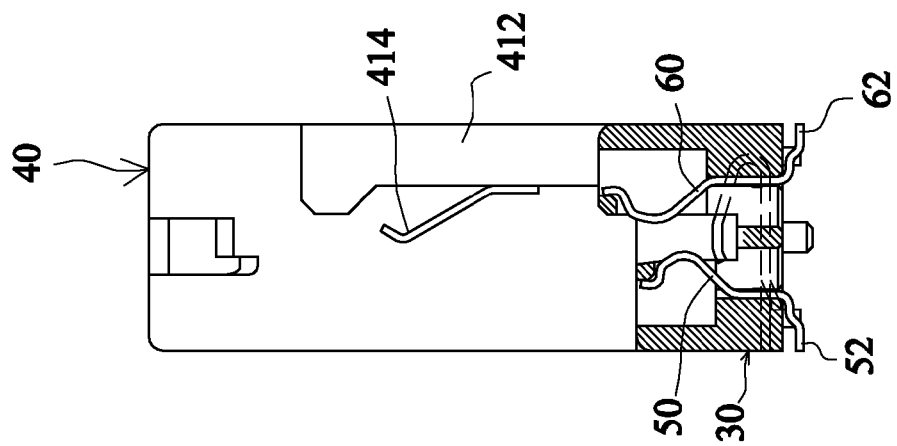

As shown in FIG. 30, the eighth embodiment is almost the same as the seventh embodiment except that pins 52 of the first terminals 50 and pins 62 of the second terminals 60 are horizontal. In addition, the rib 412 on an inner side of each of the two lateral arms is formed with an elastic sheet 414.

The board engaging structure 40 in each of the fifth to eighth embodiments are integrally formed on two sides of the plastic base 30 by way of injection molding and are in the form of two lateral arms extending toward the front end of the plastic base 30. Because the ribs 412 are added to the inner edges of the two lateral arms, the intensities of the lateral arms can be increased and the lateral arms can support the circuit board. In addition, the board engaging structures may be metal arms assembled with two sides of the plastic base.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. An electrical connector to be disposed on a main board, and to be connected to and engaged with a circuit board, the electrical connector comprising:

a plastic base, which is stationarily fixed to the main board and formed with a connection slot, wherein the connection slot is provided with a first point and a second point distant from the first point, the connection slot has an opening, and one end of the circuit board may be inserted into and connected to the opening;

a plurality of terminals disposed on the plastic base, wherein each of the terminals has a projecting connection point disposed on the connection slot, the terminals comprise one row of first terminals and one row of second terminals, the connection point of the first terminal and the connection point of the second terminal project in opposite directions, and a line connecting the connection point of the first terminal to the connection point of the second terminal is not perpendicular to an upper surface of the circuit board;

a board engaging structure having at least one engaging portion, which can engage with the circuit board when the circuit board is inserted into the connection slot for positioning; and at least one elastic card-ejecting member, which enters a forced state when the one end of the circuit board is inserted into the connection slot by a stroke and thus reaches the first point of the connection slot, and pushes the circuit board out by another stroke so that the circuit board is engaged with the engaging portion when the elastic card-ejecting member bounces, wherein the one end of the circuit board is located at the second point of the connection slot, and the other end of the circuit board is disposed outside the plastic base and is engaged by the at least one engaging portion.

2. The electrical connector according to claim 1, wherein each of two sides of the plastic base is formed with an elastic card-ejecting member slot, the elastic card-ejecting member is disposed in the elastic card-ejecting member slot, the elastic card-ejecting member slot communicates with the connection slot, and one end of the elastic card-ejecting member is disposed on the connection slot.

3. The electrical connector according to claim 1, wherein the elastic card-ejecting member has a U shape.

4. The electrical connector according to claim 1, wherein the opening of the connection slot of the plastic base faces backwards, the connection point of each of the second terminals projects upwards, and the connection point of each of the first terminals projects downwards and is located in front of and above the connection point of the second terminal.

5. The electrical connector according to claim 4, wherein:
the elastic card-ejecting member has not yet entered the forced state when the circuit board is slantingly inserted into the connection slot; and
the elastic card-ejecting member enters the forced state after the circuit board is rotated to be horizontal to elastically press the row of first terminals and the row of second terminals, and then inserted inwards again.

6. The electrical connector according to claim 2, wherein the opening of the connection slot of the plastic base faces backwards, the board engaging structure is disposed in back of the plastic base by a distance and fixed to the main board, and the engaging portion engages with the one end of the circuit board.

7. The electrical connector according to claim 6, wherein the board engaging structure has two engaging portions disposed on two sides of the board engaging structure.

8. The electrical connector according to claim 6, wherein:
the board engaging structure has an elastic grounding sheet;
when the one end of the circuit board is engaged with the engaging portion, the circuit board can be connected to the elastic grounding sheet; and
when the one end of the circuit board is disengaged from the engaging portion, the elastic grounding sheet increases an upward bouncing force for bouncing the circuit board.

9. An electrical connector to be disposed on a main board, and to be connected to and engaged with a circuit board, the electrical connector comprising:
a plastic base, which is fixed to the main board and formed with a connection slot, wherein the connection slot has an opening, and one end of the circuit board may be inserted into and connected to the opening;
a plurality of terminals disposed on the plastic base, wherein each of the terminals has a projecting connection point disposed on the connection slot;
a board engaging structure having at least one engaging portion, which can engage with the circuit board when the circuit board is inserted into the connection slot for positioning; and
at least one elastic card-ejecting member, which enters a forced state when the one end of the circuit board is inserted into the connection slot by a stroke, and pushes the circuit board out by another stroke so that the circuit board is engaged with the engaging portion when the elastic card-ejecting member bounces, wherein the board engaging structure comprises two lateral arms, which are disposed on two sides of the plastic base and extend toward the opening of the connection slot, and an engaging portion is disposed near an outer end of each of the lateral arms.

10. The electrical connector according to claim 9, wherein the two lateral arms and the plastic base are integrally formed by way of injection molding.

11. The electrical connector according to claim 10, wherein a rib is integrally formed with an inner-side lower edge of each of the lateral arms, the rib extends from the plastic base to one end of the lateral arm, and the circuit board may be supported by the rib when the circuit board is inserted into the connection slot.

12. The electrical connector according to claim 11, wherein an elastic sheet is disposed on the rib to elastically press the circuit board, and a resilience of the elastic sheet increases an ejecting force when the circuit board is disengaged from the engaging portion.

13. The electrical connector according to claim 1, wherein the opening of the connection slot of the plastic base faces upwards, and the connection points of the first terminals are lower than the connection points of the second terminals.

14. An electrical connector to be disposed on a main board, and to be connected to and engaged with a circuit board, the electrical connector comprising:
a plastic base, which is fixed to the main board and formed with a connection slot, wherein the connection slot has an opening, and one end of the circuit board may be inserted into and connected to the opening;
a plurality of terminals disposed on the plastic base, wherein each of the terminals has a projecting connection point disposed on the connection slot;
a board engaging structure having at least one engaging portion, which can engage with the circuit board when the circuit board is inserted into the connection slot for positioning; and
at least one elastic card-ejecting member, which enters a forced state when the one end of the circuit board is inserted into the connection slot by a stroke, and pushes the circuit board out by another stroke so that the circuit board is engaged with the engaging portion when the elastic card-ejecting member bounces, wherein the elastic card-ejecting member and the board engaging structure are integrally formed and fixed to the main board located in back of the plastic base by a distance, the elastic card-ejecting member has two elastic arms extending toward two sides, a positioning rod is connected to a distal end of each of the elastic arms, and a through hole for positioning the positioning rod is formed on each of two sides of the one end of the circuit board.

15. The electrical connector according to claim 14, wherein a hand pushing portion is disposed near the distal end of each of the elastic arms so that a hand can push the hand pushing portion.

16. The electrical connector according to claim 14, wherein the board engaging structure has a top plate, a rear plate and a bottom plate and substantially has a ⊏shape, the engaging portion is disposed on two sides of the top plate, and the elastic card-ejecting member is connected to a middle of a front end of the bottom plate.

17. The electrical connector according to claim 16, wherein a notch is formed between the rear plate and the top plate of the board engaging structure so that a hand can push the circuit board through the notch.

* * * * *